US005220230A

United States Patent [19]

Niitsuma

[11] Patent Number: 5,220,230

[45] Date of Patent: Jun. 15, 1993

[54] SURFACE ACOUSTIC WAVE DEVICE

[75] Inventor: Teruo Niitsuma, Tokyo, Japan

[73] Assignee: Clarion Co., Ltd., Tokyo, Japan

[21] Appl. No.: 780,893

[22] Filed: Oct. 23, 1991

[30] Foreign Application Priority Data

Oct. 23, 1990 [JP] Japan ................................ 2-285126

[51] Int. Cl.[5] ........................................ H01L 41/08

[52] U.S. Cl. ........................ 310/313 D; 310/313 R; 364/819; 333/150

[58] Field of Search ...................... 310/313 D, 313 R; 333/150, 193; 364/819, 821

[56] References Cited

U.S. PATENT DOCUMENTS 3,675,163 7/1972 Hartmann et al. .............. 310/313 R
4,224,683 9/1980 Adkins ........................... 310/313 R
4,739,290 4/1988 Minarik et al. ................. 310/313 R

FOREIGN PATENT DOCUMENTS 0229049 11/1969 U.S.S.R. ............................ 364/819
0742968 6/1980 U.S.S.R. ............................ 364/819

*Primary Examiner*—Mark O. Budd
*Assistant Examiner*—Thomas M. Dougherty
*Attorney, Agent, or Firm*—Flynn, Thiel, Boutell & Tanis

[57] ABSTRACT

An SAW (surface acoustic wave) device is disclosed, in which a plurality of SAW delay lines and a plurality of SAW convolver elements are combined; signals delayed by predetermined amounts by the combined SAW delay lines are used as input signals to the SAW convolver elements; and output signals thus obtained from the plurality of SAW convolver elements are added together to be taken out so that apparently a processing time, which is equal to a signal processing time of a single SAW convolver element multiplied by an integer, can be obtained.

14 Claims, 5 Drawing Sheets

SURFACE ACOUSTIC WAVE DEVICE

FIELD OF THE INVENTION

The present invention relates to an improvement of a surface acoustic wave device useful for a spread spectrum (hereinbelow abbreviated to SS) communication system.

BACKGROUND OF THE INVENTION

Surface acoustic wave (hereinbelow abbreviated to SAW) convolver elements, to which attention is paid recently as a key device in the SS communication system or a device for real time signal processing such as Fourier transformation, etc., are classified roughly into elastic type, air gap type and monolithic type, according to differences in the structure or the working principle thereof. All of them have a basic structure consisting of a pair of interdigital electrodes 1 converting electric signals into SAW and a region 3, where two SAWs propagating under an output electrode 2 in directions opposite to each other are multiplied by each other and integrated.

A product (BT product) of a time (signal processing time: T), in which the SAWs pass through the region described above, by a working frequency bandwidth B of an element corresponds to a process gain and in general it is thought that the greater the BT product is, the larger the signal processing capacity is. However, since T is determined by the size of the element, it is limited by fabrication conditions, etc. for a piezoelectric monocrystal substrate or a piezoelectric thin film, which is a starting material thereof and at present T obtained by a single SAW convolver element is about 20 μsec. In order to increase the BT product, it is possible also to adopt a method, by which B is widened instead of lengthening T. In fact, it can be thought that this method is more useful, in the case where a high speed data transmission is effected in the SS communication, etc. However, e.g. in the case where an SAW convolver element is used in a real-time Fourier transformer, etc., the necessity of elements having a long T is great.

Further, even if there are no limitations in the size of the substrate, since the propagation loss of the SAW within the element increases in general with the increasing signal processing time, there is a tendency that an output signal level for a same input signal level is lowered with increasing T. In order to compensate this level lowering, an amplifying circuit is disposed in the input or the output. It is more advantageous to raise the input signal level for utilizing the S/N ratio improving effect by the process gain (BT product) of the element. However, usually, since the upper limit of the linear region in input and output characteristics of the element depends on the intensity of the SAW in the neighborhood of the input interdigital electrode, the optimum input signal level is not influenced remarkably by the length of the signal processing time and remains at an approximately same level. Compared in the optimum working state, it is impossible to avoid that the output signal level is lowered in an element having a long signal processing time.

OBJECT OF THE INVENTION

The present invention has been done in order to solve the problems described above and the main object thereof is to provide an SAW device capable of prolonging the signal processing time in an SAW element without being limited by the material of the element or the fabrication conditions.

SUMMARY OF THE INVENTION

A first invention of the present application is characterized in that it comprises a first delay line connected with a first input terminal; a second delay line connected with a second input terminal; a first SAW convolver, in which an input signal to the first delay line is inputted through one input and an output signal of the second delay line is inputted through another input; a second SAW convolver, in which an output signal of the first delay line is inputted through one input and an input signal to the second delay line is inputted through another input; and adding means for adding outputs of the first and the second SAW convolver.

A second invention of the present application is characterized in that it comprises a first group of N−1 delay lines connected in series one after another up to a first input terminal; a second group of N−1 delay lines connected in series one after another up to a second input terminal; a first stage SAW convolver, in which an input signal to a first stage in the first group of delay lines is inputted through one input and an output signal of a last stage of the second group of delay lines is inputted through another input; a last stage SAW convolver, in which an output signal of a last stage of the second group of delay lines is inputted through one input and an input signal to a first stage of the second group of delay lines is inputted through another input; N−2 intermediate SAW convolvers, in each of which an output of one of the delay lines of the first group of delay lines is supplied through one input of one of succeeding stages consecutively one after another from the first stage side and an input of one of the delay lines of the second group of delay lines is supplied through another input of one of succeeding stages consecutively one after another from the last stage side; and synthesizing means for adding outputs of the SAW convolvers.

A second invention of the present application is characterized in that it comprises a first group of N+1 delay lines connected in series one after another up to a first input terminal; a second group of N+1 delay lines connected in series one after another up to a second input terminal; a first stages SAW convolver, in which an input signal to a first stage in the first group of delay lines is inputted through one input and an output signal of a last stage of the second group of delay lines is inputted through another input; N SAW convolvers, in each of which an output signal of one of the delay lines of the first group of delay lines consecutively one after another from a first stage to an N-th stage is inputted through one input of one of succeeding stages and an output of one of the delay lines of the second group of delay lines consecutively one after another from the N-th stage to the first stage is inputted through another input of one of succeeding stages; and synthesizing means for adding outputs of the SAW convolvers.

According to each of the inventions described above, since a convolver is constructed by using a plurality of SAW convolver elements, by which the length of the single processing time is limited, and combining a plurality of delay lines therewith, it is possible to realize an SAW convolver having a signal processing time, which is equal apparently to that of a single element multiplied by an integer.

DETAILED DESCRIPTION

Figure 2:
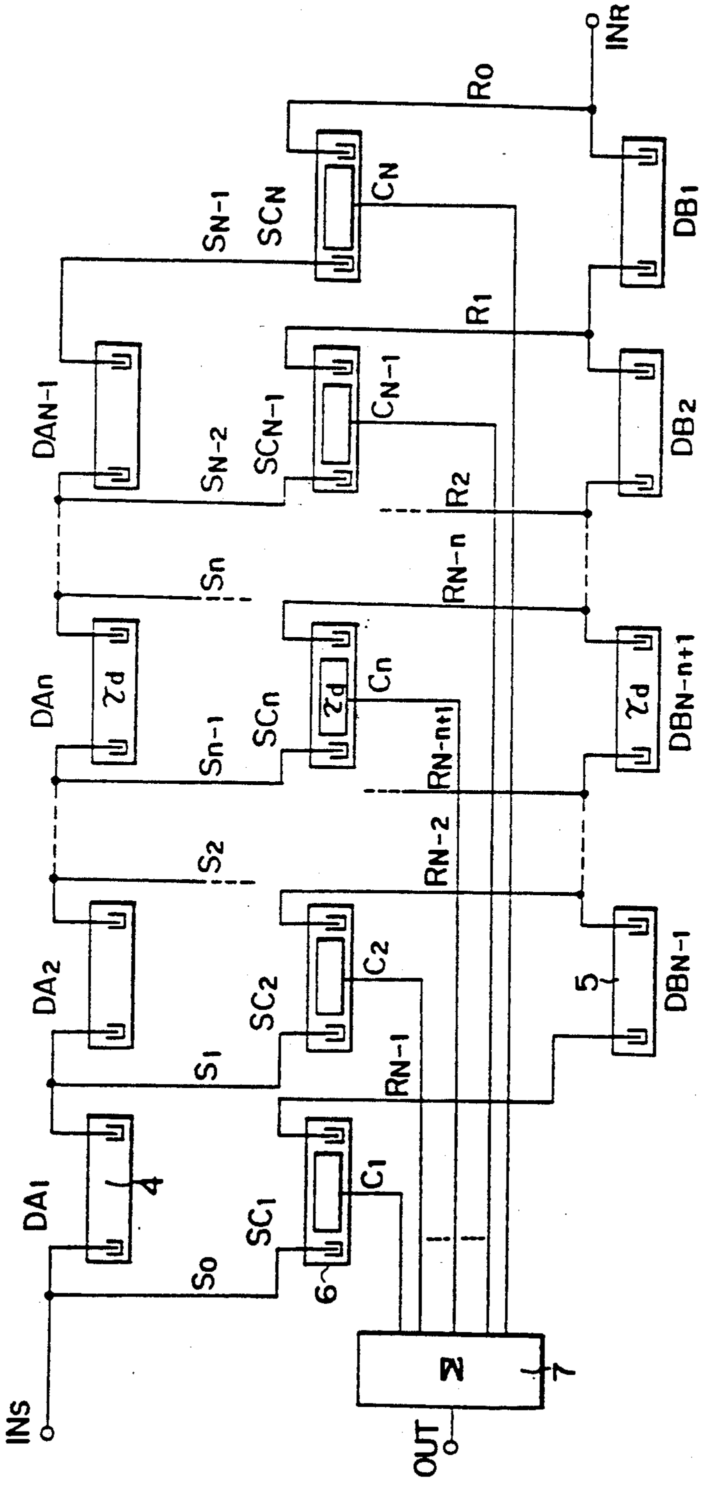
FIG. 2 is a scheme showing the construction of an SAW convolver, which is an embodiment of the present invention.

FIG. 2 shows an embodiment of the SAW convolver device according to the present invention.

At first the principle of the operation of the embodiment will be explained. An output C(t) obtained when 2 signals f(t) and g(t) are inputted in an SAW convolver element having a signal processing time T is given by Equation (1):

$$C(t) = \gamma \int_0^T f(t-\tau)\cdot g(t-T+\tau)\cdot d\tau \tag{1}$$

where $\gamma$ is a constant representing an element efficiency determined by the magnitude of the propagation loss and the non-linear effect of the SAW within the element.

In FIG. 2, $DA_1, DA_2, \ldots DA_{N-1}$ ($DA_n \ldots$ 4) $DB_1, DB_2, \ldots, DB_{N-1}$ ($DB_n \ldots$ 5) are SAW delay lines, all having same characteristics, and SC1, SC2 . . . , $SC_{N-1}$ are SAW convolver elements, all having same characteristics. The delay time of each of the SAW delay lines $DA_n$, $DB_n$ and the signal processing time of each of the SAW convolver elements $SC_n$ are equal to each other and to $\tau d$.

Here all the elements are combined so that denoting signals obtained by ramifying the output signals from the SAW delay lines $DA_n$ and $DB_n$ to the succeeding stages by $S_n$ and $R_n$, respectively, input signals to the SAW convolver element $SC_n$ are represented by $S_{n-1}$ and $R_{N-n}$. In addition, there is disposed means 7 for adding the output signals $C_n$ from all the SAW convolver elements to each other to output the sum of them.

Denoting the input signals at $IN_S$ and $IN_R$ by S(t) and R(t), respectively, neglecting loss accompanied by the in and output and the ramification of the signals between different delay lines, and paying attention only to loss and delay accompanied by the propagation, the input signals $S_{n-1}$ and $R_{N-n}$ to the SAW convolver $SC_n$ can be represented as follows:

$$S_{n-1}=\alpha^{n-1}\cdot S(t-(n-1)\tau d) \tag{2}$$

$$R_{N-N}=\alpha^{N-n}\cdot R(t-(N-n)\tau d) \tag{3}$$

where $\alpha$ indicates an attenuation coefficient for every delay line.

Consequently, by using Equation (1), the output $C_n$ (t) from the SAW convolver element $SC_n$ can be expressed as follows:

$$C_n(t) = \gamma_n \int_0^{\tau d} \alpha^{n-1}\cdot S(t-(n-1)\tau d-\tau)\cdot \alpha^{N-n}\cdot R(t-(N-n)\tau d-\tau d+\tau)\cdot d\tau$$

Further, by shifting the integration domain, $$C_n(t) = \gamma_n\cdot\alpha^{n-1}\int_{(n-1)\tau d}^{n\tau d} S(t-\tau)R(t-N\cdot\tau d+\tau)\cdot d\tau \tag{4}$$

can be obtained. Here, since $\gamma_n$ remains constant for all the SAW convolver elements constituting the device, putting $\gamma_n=\gamma$, the output $C_{out}(t)$ obtained by adding all the outputs of the SAW convolver elements $SC_1$ to $SC_N$ to each other in an adding section 7 can be given by a following equation:

$$\begin{aligned} Cout(t) &= \sum_{i=1}^{N} Ci(t) = \sum_{i=1}^{N}\gamma\cdot\alpha^{n-1}\int_{(i-1)\tau d}^{i\tau d} S(t-\tau)\cdot R(t-N\tau d+\tau)\cdot d\tau \\ &= \gamma\alpha^{n-1}\int_0^{N\cdot\tau d} S(t-\tau)\cdot R(t-N\tau d+\tau)\cdot d\tau \end{aligned} \tag{5}$$

As it can be understood, when Equation (5) is compared with Equation (1), Equation (5) represents a quantity proportional to an output obtained when the signals S(t) and R(t) are inputted in an SAW convolver having a delay time in the signal processing region, which is $\tau d$ multiplied by N and indicates that according to the construction of the present invention it is possible to obtain a composite SAW convolver having a processing time, which is equal apparently to the processing time multiplied by an integer, by combining a plurality of SAW convolvers, each of which has only the processing time $\tau d$.

However, although, in the above explanation, proportionality constants multiplied by integration terms in Equation (4) are equal for all the SAW convolver elements, because loss of the signal accompanied by the ramification to each SAW convolver element is neglected, in reality since the condition of the ramification for the input signals corresponding to n=1 and N differs from that for the other signals corresponding to n=2, . . . , N−1, in the case where loss accompanied by transmission and reception of the signal is taken into account, when the outputs of the SAW convolver elements are added simply, there is a possibility that the spurious noise suppressing ratio at the total output is worsened. This point will be explained for a case of the construction indicated in FIG. 3, where N=4.

Figure 3:
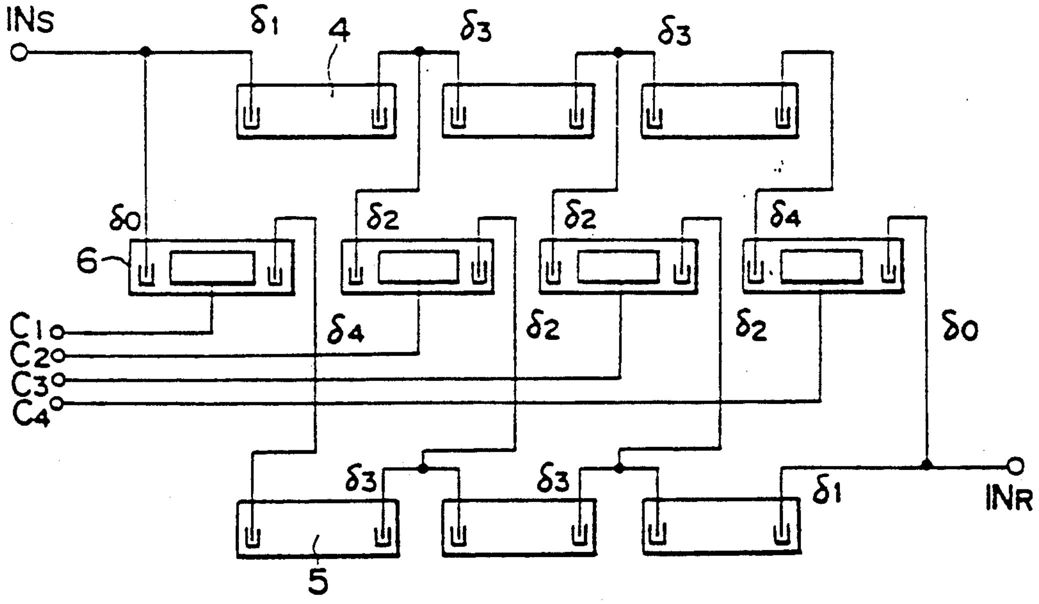
FIG. 3 is a scheme showing the construction of the principal part for explaining the operation thereof.

In FIG. 3, $\delta_0$ means the sum of the loss due to the ramification of the input signal to the first stage of the delay line from each of the input terminals $IN_S$ and $IN_R$ and the loss due to the mismatching when the signal is inputted in the relevant SAW convolver element; $\delta_1$ means the sum of the loss due to a similar ramification and the loss due to the mismatching when the signal is inputted in the delay line; $\delta_2$ means the loss due to the ramification of the output of the preceding stage of the delay line and the loss when the signal is inputted in the relevant SAW convolver element; $\delta_3$ means the sum of the loss due to the same ramification as that in $\delta_2$ and the loss mismatching when the signal is inputted to the next stage of the delay line; and $\delta_4$ means the loss due to the mismatching when the signal is inputted from the last stage of the delay line to the relevant SAW convolver element. In this case the outputs $C_1$ to $C_4$ of the different SAW convolver can be expressed as follows:

$$C_1 = \gamma \cdot \delta_0 \cdot \delta_1 \cdot \delta_3^2 \cdot \delta_4 \cdot \alpha^3 \int_0^{\tau d} S(t-\tau) \cdot R(t - 4\tau d + \tau) \cdot d\tau$$

$$C_2 = \gamma \cdot \delta_1^2 \cdot \delta_2^2 \cdot \delta_3 \cdot \alpha^3 \int_{\tau d}^{2\tau d} S(t-\tau) \cdot R(t - 4\tau d + \tau) \cdot d\tau$$

$$C_3 = \gamma \cdot \delta_1^2 \cdot \delta_2^2 \cdot \delta_3 \alpha^3 \int_{2\tau d}^{3\tau d} S(t-\tau) \cdot R(t - 4\tau d + \tau) \cdot d\tau$$

and $$C_4 = \gamma \cdot \delta_0 \cdot \delta_1 \cdot \delta_3^2 \cdot \delta_4 \alpha^3 \int_{3\tau d}^{4\tau d} S(t-\tau) \cdot R(t - 4\tau d + \tau) \cdot d\tau$$

As described above, for a general n, the constant multiplied by the integral term in the equation representing the output $C_n$ of the relevant SAW convolver element is given by:

if $n=1$ or N, $\gamma \cdot \delta_0 \cdot \delta_1 \cdot \delta_3^{N-2} \cdot \delta_4 \cdot \alpha^{N-1}$ if $n=2, 3, \ldots N-1$, $\gamma \cdot \delta_1^2 \cdot \delta_2^2 \cdot \delta_3^{N-3} \cdot \alpha^{N-1}$ Consequently they cannot be added simply, as it is done, when Equation (5) is obtained, starting from Equation (4).

Figure 4:
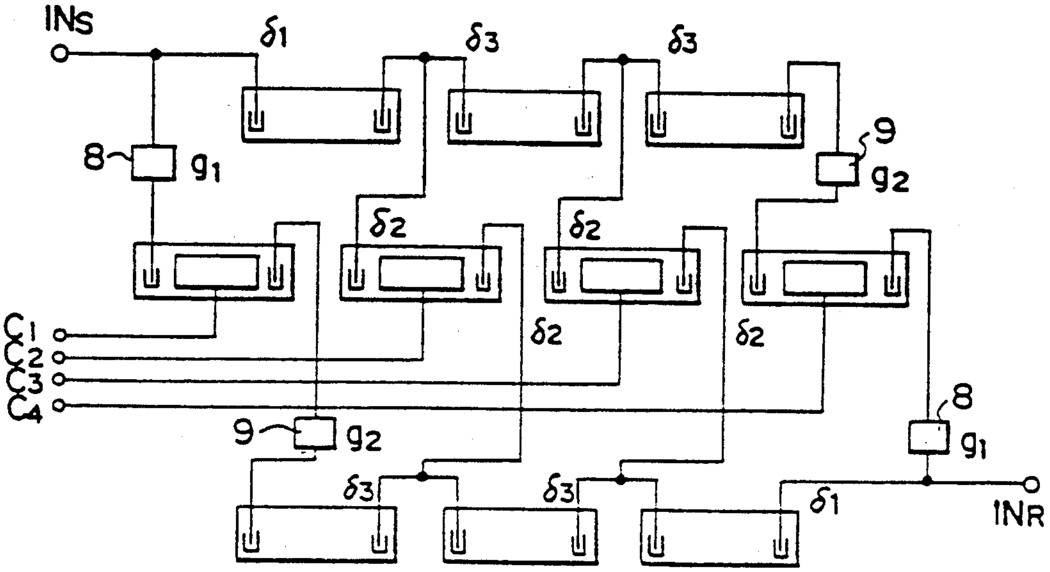
FIGS. 4 and 5 are schemes showing the construction of the principal part of other different embodiments of the present invention.

FIG. 4 shows a construction, in which amplifiers or attenuators 8 and 9 for regulating the input signal levels to the SAW convolvers of $n=1$ and $n=N$, respectively, are added, in order to solve the problem described above. Denoting the gains of these regulating circuits by $g_1$ and $g_2$, as indicated in the figure, $g_1$ and $g_2$ are set so as to satisfy $$g_1 \cdot g_2 = \frac{\delta_1 \cdot \delta_2^2}{\delta_3}$$

In this way it is possible to add simply the outputs of all the SAW convolver elements and to achieve the effect of the present invention.

Figure 5:
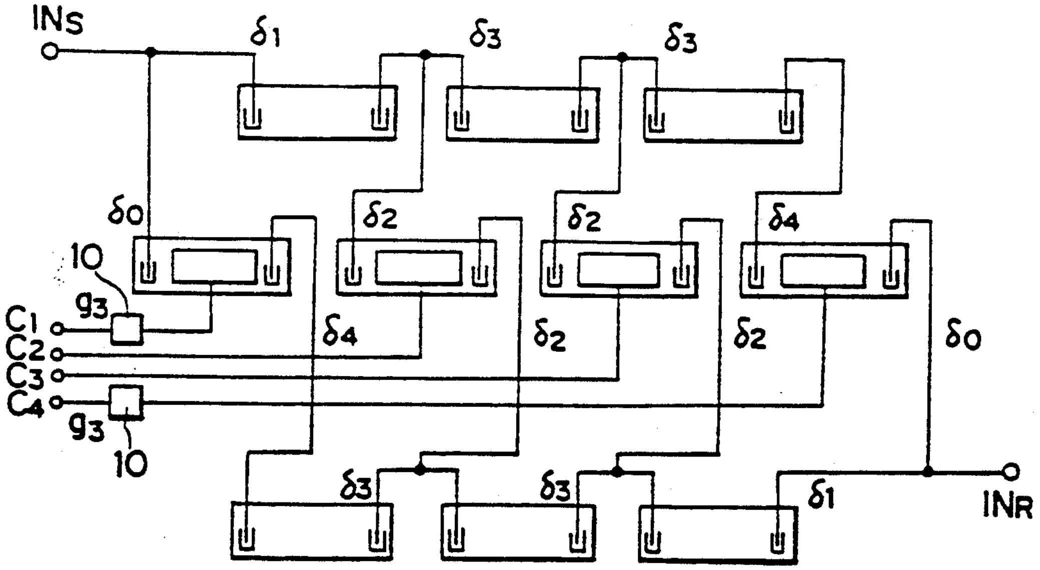

Further FIG. 5 shows a construction, in which the amplifiers or attenuators 10 regulating the output levels of the SAW convolver elements of $n=1$ and $n=N$ are added. The problem can be solved also by setting $$g_3 = \frac{\delta_1 \cdot \delta_2^2}{\delta_0 \cdot \delta_3 \cdot \delta_4}$$

where $g_3$ represents the gain of this circuit and thus the effect of the present invention can be achieved.

However, in the case where N is satisfactorily great, since the contribution of the output of each SAW convolver element alone to the total output $C_{out}$ is relatively small, the present invention has a satisfactory effect also by the basic construction indicated in FIG. 2.

Figure 6:
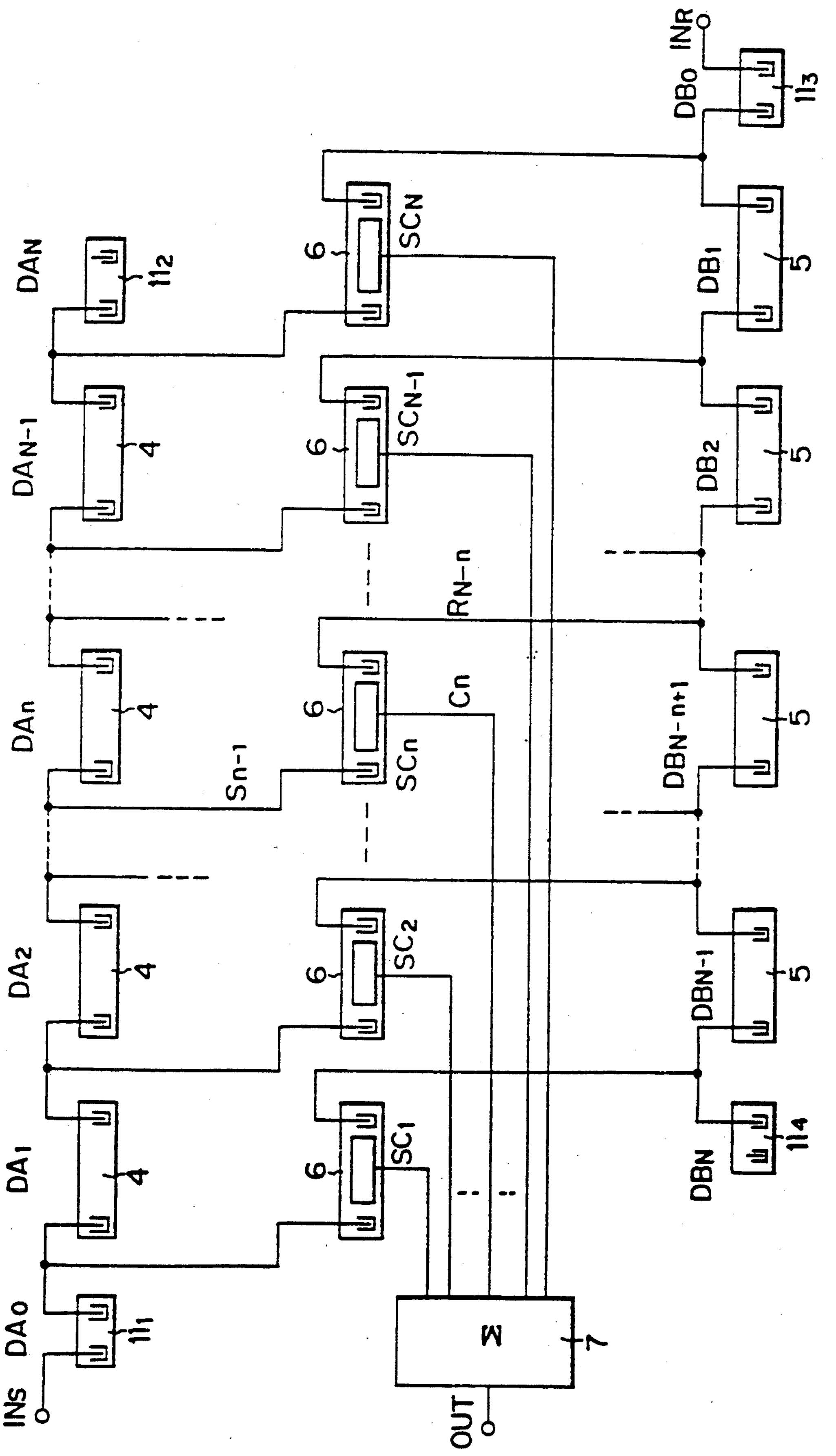
FIGS. 6 and 7 are schemes showing the construction of SAW convolver devices, which are other different embodiments of the present invention.

FIG. 6 shows another embodiment of the SAW convolver device according to the present invention.

Here $DA_1, DA_2, \ldots, DA_{N-1}$, ($DA_n$ . . . 4) and $DB_1, DB_2, \ldots, DB_{N-1}$, ($DB_n$ . . . 5) are SAW delay lines, all of them having same characteristics and $DA_0$ . . . 11$_1$, $DA_N$ . . . 11$_2$, $DB_0$ . . . 11$_3$, $DB_N$ . . . 11$_4$ are SAW delay lines, which are identical to $DA_n$, $DB_n$ or have the characteristics differing therefrom only in the delay time. Further $SC_1, SC_2, \ldots, SC_N$ ($SC_n$ . . . 7) are SAW convolver elements, all of them having same characteristics. All of the delay times of the delay lines 4 and 5 and the signal processing times of the SAW convolver elements are equal to $\tau d$.

The delay lines $DA_n$ and $DB_n$ are connected in series one after another up to the external signal input terminals $IN_S$ and $IN_R$, respectively. The delay lines of last stage $DA_N$ and $DB_N$, in each of which only the input electrode is connected with the output of the delay line of preceding stage, are used as load thereof. Further, all the elements are combined so that denoting signals obtained by ramifying the output signals from the delay lines $DA_n$ and $DB_n$ to $DA_{n+1}$ and $DB_{n+1}$ by $S_n$ and $R_n$, respectively, input signals to the SAW convolver element $SC_n$ are represented by $S_{n-1}$ and $R_{n-1}$. In addition, there is disposed means 7 for adding the output signals $C_n$ from all the SAW convolver elements to each other to output the sum of them.

In each of the delay lines described above, denoting the attenuation coefficient of the signal due to the fact that the output of the delay line of preceding stage is connected with the input of the delay line of succeeding stage through means for ramifying the signal to the relevant SAW convolver element in the middle course thereto by $\delta_1$; the attenuation coefficient of the signals due to the fact that the output of each of the delay lines is inputted in the relevant SAW convolver element through means for ramifying the signal to the delay line of succeeding stage in the middle course thereof by $\delta_2$, and the attenuation coefficient by the propagation of the SAW within the delay lines 4 and 5 by $\alpha$, when the signals applied to the input terminals $IN_S$ and $IN_R$ are S(t) and R(t), respectively, the signals $S_{n-1}(t)$ and $R_{N-n}(t)$ inputted in the SAW convolver element $SC_n$ are in following relations with respect thereto;

$$S_{n-1}(t) = \delta a \cdot \delta_1^{n-1} \cdot \alpha^{n-1} \cdot \delta_2 \cdot S(t-(n-1)\tau d - \tau a)$$

$$R_{N-n}(t) = \delta b \cdot \delta_1^{N-n} \cdot \alpha^{N-n} \cdot \delta_2 \cdot R(t-(N-n)\tau d - \tau b)$$

where $\delta_1$ and $\tau_a$ as well as $\delta_b$ and $\tau_b$ represent attenuation coefficients by the input mismatching and the SAW propagation and propagation delay times at $DA_0$ as well as $DB_0$, respectively.

The output $C_n(t)$ of the $SC_n$ can be expressed as follows, by using Equation (1);

$$C_n(t) = \gamma_n \int_0^{\tau d} \delta a \cdot \delta_1^{n-1} \delta_2 \cdot \alpha^{n-1} \cdot S(t-(n-1)\tau d - \tau a - \tau) \times \delta b \delta_1^{N-n} \cdot \delta_2 \cdot \alpha^{N-n} \cdot R(t-(N-n)\tau d - \tau b - \tau d + \tau) \cdot d\tau$$

By shifting the integration domain to $(n-1)\tau d \sim n\tau d$ and further since $\gamma_n$ remains constant for all the SAW convolver elements $SC_n$, putting $\gamma_n = \gamma$ and rearranging the right member, $$C_n(t) = \gamma \cdot \delta a \cdot \delta b \cdot \delta_1^{N-1} \delta_2^2 \cdot \alpha^{N-1} \int_{(n-1)\tau d}^{n \cdot \tau d} S(t - \tau a - \tau) \cdot R(t - N\tau d - \tau b + \tau) d\tau$$

is obtained. Consequently the output $C_{out}(t)$ obtained by adding the outputs of all the SAW convolver elements can be obtained as follows:

$$Cout(t) = \sum_{i=1}^{N} Ci(t) = \gamma \cdot \delta a \cdot \delta b \cdot \delta_1^{N-1} \cdot \delta_2^2 \cdot \alpha^{N-1} \int_0^{N\tau d} S(t - \tau a - \tau) \cdot R(t - \tau b - N\tau d + \tau) \cdot d\tau \quad (6)$$

Figure 1:
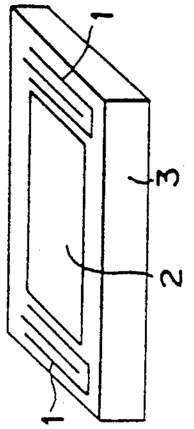
FIG. 1 is a perspective view showing the basic construction of an SAW convolver.

This indicates that the signal thus obtained is proportional to the output obtained by inputting 2 signals $S(t-\tau a)$ and $R(t-\tau b)$ in an SAW convolver having a signal processing time of $N\tau d$ and that similarly to the case indicated in FIG. 1, owing to the construction of the present invention, the signal processing time, which was $\tau d$ for a single element, can be prolonged apparently to a time, which is an integer times as long as it.

Figure 7:
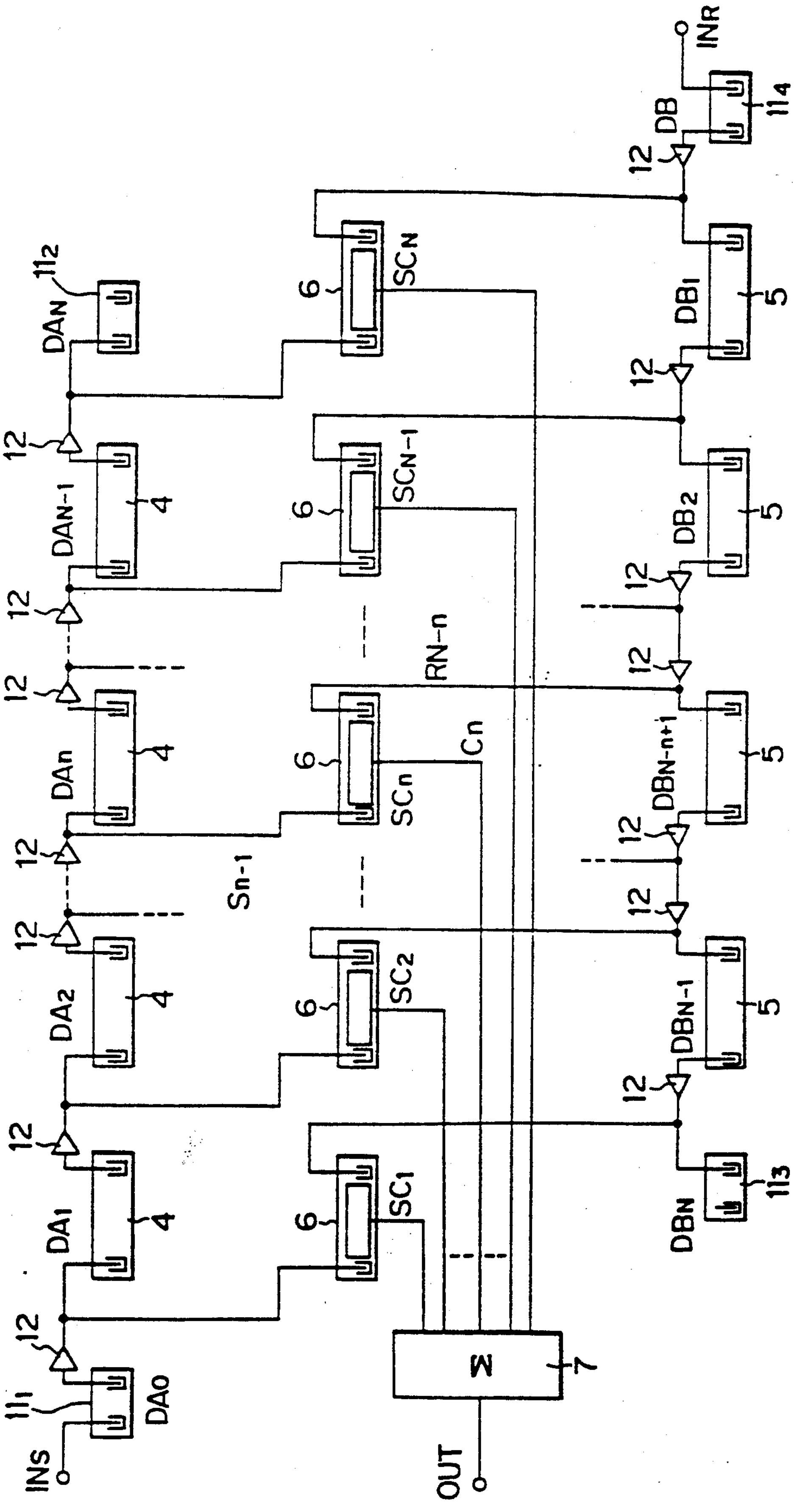

FIG. 7 shows still another embodiment of the SAW convolver device according to the present invention.

In this embodiment, it is constructed similarly to that indicated in FIG. 6, except that the delay lines $DA_n$ and $DB_n$ are connected in series, putting an amplifier 12 between every two adjacent delay lines, up to the input terminals $IN_S$ and $IN_R$.

Now the attenuation coefficients by the mismatching of the signal at $DA_0$ and $DB_0$ and the propagation of the SAW are denoted by $\delta a$ and $\delta b$, respectively; the delay times of $DA_0$ and $DB_0$ by $\tau a$ and $\tau b$, respectively; and the attenuation coefficient by the propagation of the SAW in $DA_1 \sim DA_{N-1}$ and $DB_1 \sim DB_{N-1}$ by $\alpha$. Further, denoting the attenuation coefficient due to the fact that the signals are transmitted from the delay lines $DA_n$ and $DB_n$ to the delay lines $DA_{n+1}$ and $DB_{n+1}$ of succeeding stage through means for ramifying signals, respectively, when the amplification factor g of the amplifier 12 is 1, by $\delta_1$ and the attenuation coefficient due to the fact that the signals are transmitted from the delay lines $DA_n$ and $DB_n$ to the relevant SAW convolver element through means for ramifying signals, when $g=1$, by $\delta_2$, when the signals applied to the input terminals $IN_S$ and $IN_R$ are S(t) and R(t), respectively, the signals $S_{n-1}(t)$ and $R_{N-n}(t)$ inputted in the SAW convolver element $SC_n$ are in following relations with respect thereto;

$$S_{N-1}(t)=\delta a \cdot \delta_1^{n-1} \cdot \alpha^{n-1} \cdot \delta_2 \cdot g^n \cdot S(t-(n-1)\tau d-\tau a) \quad (7)$$

$$R_{N-n}(t)=\delta b \cdot \delta_1^{N-n} \cdot \alpha^{N-n} \cdot \delta_2 \cdot g^{N-n+1} \cdot R(t-(N-n)\tau d-\tau b) \quad (8)$$

Consequently the output $C_n(t)$ can be expressed as follows, by using Equation (1);

$$C_n = \gamma_n \cdot \int_0^{\tau d} \delta a \cdot \delta_1^{n-1} \cdot \alpha^{n-1} \cdot \delta_2 \cdot g^n \cdot S(t - (n-1)\tau d - \tau a - \tau) \times \delta b \cdot \delta_1^{N-n} \cdot \alpha^{N-n} \cdot \delta_2 \cdot g^{N-n+1} \cdot R(t - (N-n)\tau d - \tau b - \tau d + \tau) \cdot d\tau$$

By shifting the integration domain to $(n-1)\tau d \sim n\tau d$ and further since $\gamma_n$ remains constant for all the SAW convolver elements $SC_n$, putting $\gamma_n=\gamma$ and rearranging the right member, $$C_n = \gamma \cdot \delta a \cdot \delta b \cdot \delta_1^{N-1} \delta_2^2 \cdot \alpha^{N-1} \cdot g^{N+1} \int_{(n-1)\tau d}^{n\tau d} S(t - \tau a - \tau) \cdot R(t - N\tau d - \tau b + \tau) \cdot d\tau$$

is obtained. Consequently the output $C_{out}(t)$ obtained by adding the outputs of all the SAW convolver elements can be obtained as follows;

$$Cout(t) = \sum_{i=1}^{n} Ci(t) = \gamma \cdot \delta a \cdot \delta b \cdot \delta_1^{N-1} \cdot \delta_2^2 \cdot \alpha^{N-1} g^{N+1} \int_0^{N\tau d} S(t - \tau a - \tau) \cdot R(t - \tau b - N\tau d + \tau) \cdot d\tau$$

This indicates that a single proportional to the output obtained by inputting 2 signals $S(t-\tau a)$ and $R(t-\tau b)$ in an SAW convolver having a signal processing time of $N\tau d$ can be taken out. Here, when the amplification factor is set at $g=1/(\delta_1 \cdot \alpha)$, as it can be understood from;

$$Cout(t) = \gamma \cdot \delta a \cdot \delta b \cdot \delta_2^2 \cdot g^2 \int_0^{N\tau d} S(t - \tau a - \tau) \cdot R(t - \tau b - N\tau d + \tau) \cdot d\tau$$

the apparent efficiency of the element doesn't depend on the magnitude of N. As it can be seen from Equations (7) and (8), the setting of $g=1/(\delta_1 \cdot \alpha)$ is a condition, under which the input signal levels to the different SAW convolver elements are equal to each other, and if the signals applied to $IN_S$ and $IN_R$ are regulated so that the input signal levels to the single SAW convolver elements constituting the device according to the present invention are optimum, all the SAW convolver elements, which are the constituent elements, are driven in the optimum state.

Further the material and the structure of the substrate for the SAW delay lines and the SAW convolver elements, which are constituent elements of the present invention, are subjected basically to any restrictions, but the SAW convolver device according to the present invention can be constructed by any combination of SAW delay lines made of either one of a piezoelectric monocrystal substrate, a piezoelectric film/elastic substrate and a piezoelectric ceramic substrate and SAW convolver elements of either one of elastic type, air gap type and monolithic type.

However, it is advantageous that an $LiNbO_3$ or $LiTaO_3$ piezoelectric monocrystal substrate is selected as the material for the delay lines, because propagation loss on the delay lines can be reduced and the load of the amplifying circuits is alleviated. Further, it is advantageous that e.g. a $ZnO/SiO_2/Si$ structure monolithic type is selected for the SAW convolver elements, because a high element efficiency can be obtained. Still further, since an SAW delay line using a piezoelectric monolithic crystal substrate has, in general, no sound velocity dispersion with respect to the frequency, it can compensate a drawback of a monolithic type SAW convolver element, which has alone an upper limit in the BT product, although it has a high efficiency, and by using it it is possible to obtain a high efficiency and a satisfactorily great effective BT product.

As explained above, according to the present invention, it is possible to realize easily an SAW convolver device having a signal processing time, which is apparently an integer times as long as that of single elements, by combining a plurality of SAW convolver elements each of which has a limited signal processing time, with a plurality of delay lines.

What is claimed is:

1. A surface acoustic wave device comprising:

a first delay line connected with a first input terminal;

a second delay line connected with a second input terminal;

a first SAW convolver, in which an input signal to said first delay line is inputted through one input and an output signal of said second delay line is inputted through another input;

a second SAW convolver, in which an output signal of said first delay line is inputted through one input and an input signal of said second delay line is inputted through another input; and adding means for adding outputs of said first and said second SAW convolver.

2. A surface acoustic wave device comprising:

a first group of N−1 delay lines connected in series one after another up to a first input terminal;

a second group of N−1 delay lines connected in series one after another up to a second input terminal;

a first stage SAW convolver, in which an input signal to a first stage in said first group of delay lines is inputted through one input and an output signal of a last stage of said second group of delay lines is inputted through another input;

a last stage SAW convolver, in which an output signal of a last stage of said first group of delay lines is inputted through one input and an input signal to a first stage of said second group of delay lines is inputted through another input;

N−2 intermediate SAW convolver, in each of which an output of one of the delay lines of said first group of delay lines is supplied through one input of one of succeeding stages consecutively one after another from the first stage side and an input of one of the delay lines of said second group of delay lines is supplied through another input of one of succeeding stages consecutively one after another from the last stage side; and synthesizing means for adding outputs of said SAW convolvers.

3. A surface acoustic wave device according to claim 2, further comprising input regulating means for amplifying or attenuating signals disposed at inputs of said first and said last stage of the SAW convolvers.

4. A surface acoustic wave device according to claim 2, further comprising input regulating means for amplifying or attenuating signals disposed at inputs of said first and said last stage of the SAW convolvers.

5. A surface acoustic wave device comprising:

a first group of N+1 delay lines connected in series one after another up to a first input terminal;

a second group of N+1 delay lines connected in series one after another up to a second input terminal;

a first stage SAW convolver, in which an input signal to a first stage in said first group of delay lines is inputted through one input and an output signal of a last stage of said second group of delay lines is inputted through another input;

N SAW convolvers, in each of which an output signal of one of the delay lines of said first group of delay lines consecutively one after another from a first stage to an N-th stage is inputted through one input of one of succeeding stages and an output of one of the delay lines of said second group of delay lines consecutively one after another from the N-th stage to the first stage is inputted through another input of one of succeeding stages; and synthesizing means for adding outputs of said SAW convolvers.

6. A surface acoustic wave device according to claim 5, further comprising amplifying means disposed between adjacent two delay lines of said first and said second group of delay lines.

7. A surface acoustic wave device according to claim 1 wherein said delay lines are SAW delay lines.

8. A surface acoustic wave device according to claim 2, wherein said delay lines are SAW delay lines.

9. A surface acoustic wave device according to claim 5, wherein said delay lines are SAW delay lines.

10. A surface acoustic wave device comprising: a first delay circuit which has input and output terminals and which includes N−1 delay elements coupled in series between said input and output terminals, where N is a positive integer greater than two; a second delay circuit which has input and output terminals and which includes N−1 delay elements coupled in series between said input and output terminals; N−1 first surface acoustic wave convolvers which each have a first input coupled to an input of a respective one of said delay elements of said first delay circuit, which each have a second input coupled to an output of a respective one of said delay elements of said second delay circuit, and which each have an output; a second surface acoustic wave convolver which has a first input coupled to said output terminal of said first delay circuit, which has a second input coupled to said input terminal of said second delay circuit, and which has an output; and means for adding signals from said outputs of each of said first and second surface acoustic wave convolvers.

11. A surface acoustic wave device according to claim 10, including first and second regulating means for respectively coupling said input terminal of said first delay circuit and said output terminal of said second delay circuit to said first and second inputs of one of said first surface acoustic wave convolvers, and third and fourth regulating means for respectively coupling said output terminal of said first delay circuit and said input terminal of said second delay circuit to said first and second inputs of said second surface acoustic wave convolver.

12. A surface acoustic wave device according to claim 10, including first regulating means for coupling to said means for adding the output of said second surface acoustic wave convolver, and second regulating means for coupling to said means for adding the output of one of said first surface wave convolvers which has said first and second inputs thereof respectively coupled to said input terminal of said first delay circuit and said output terminal of said second delay circuit.

13. A surface acoustic wave device according to claim 10, wherein each said delay element is a surface acoustic wave delay line.

14. A surface acoustic wave device according to claim 10, wherein one of said first and second delay circuits includes amplifying means for coupling an output of one of said delay elements thereof to an input of another of said delay elements thereof.

* * * * *